(12) United States Patent
Sung et al.

(10) Patent No.: US 10,026,662 B2
(45) Date of Patent: Jul. 17, 2018

(54) SEMICONDUCTOR STRUCTURE AND FABRICATING METHOD THEREOF

(71) Applicant: TAIWAN SEMICONDUCTOR MANUFACTURING CO., LTD., Hsinchu (TW)

(72) Inventors: Hsueh-Chang Sung, Hsinchu County (TW); Chih-Chiang Chang, Hsinchu County (TW); Kun-Mu Li, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/934,517

(22) Filed: Nov. 6, 2015

(65) Prior Publication Data
US 2017/0133286 A1 May 11, 2017

(51) Int. Cl.
| | |
|---|---|
| H01L 21/66 | (2006.01) |
| H01L 27/092 | (2006.01) |
| H01L 21/8238 | (2006.01) |
| H01L 29/161 | (2006.01) |
| H01L 29/165 | (2006.01) |
| H01L 29/04 | (2006.01) |
| H01L 29/08 | (2006.01) |
| H01L 29/06 | (2006.01) |
| H01L 29/78 | (2006.01) |

(52) U.S. Cl.
CPC ...... *H01L 22/30* (2013.01); *H01L 21/823807* (2013.01); *H01L 21/823814* (2013.01); *H01L 21/823821* (2013.01); *H01L 27/0924* (2013.01); *H01L 29/045* (2013.01); *H01L 29/0653* (2013.01); *H01L 29/0847* (2013.01); *H01L 29/161* (2013.01); *H01L 29/165* (2013.01); *H01L 29/7848* (2013.01)

(58) Field of Classification Search
CPC ............. H01L 29/66795; H01L 29/785; H01L 21/02532; H01L 21/823821; H01L 29/165; H01L 29/7848
USPC .... 257/401, E29.55, E21.409, 192; 438/478, 438/197, 283
See application file for complete search history.

(56) References Cited

U.S. PATENT DOCUMENTS

| | | | |
|---|---|---|---|
| 7,300,837 B2* | 11/2007 | Chen ................. | H01L 29/66628 257/E21.43 |
| 7,898,041 B2* | 3/2011 | Radosavljevic .. | H01L 29/41791 257/213 |
| 9,159,630 B1* | 10/2015 | Wei ................. | H01L 21/823821 |
| 9,166,010 B2* | 10/2015 | Kelly ................. | H01L 29/0653 |
| 9,312,274 B1* | 4/2016 | Bryant ................ | H01L 27/1211 |

(Continued)

*Primary Examiner* — Jonathan Han
(74) *Attorney, Agent, or Firm* — Maschoff Brennan

(57) ABSTRACT

A semiconductor structure includes a device region and a test region. In the device region, first fin spacers cover sidewalls of a first fin structure and have a first height, and a first epitaxy structure is disposed in the first fin structure, which a portion of the first epitaxy structure is above the first fin spacers and having a first width. In the test region, second fin spacers cover sidewalls of the second fin structure and have a second height, and the second height is greater than the first height. A second epitaxy structure is disposed in the second fin structure, and a portion of the second epitaxy structure is above the second fin spacers and having a second width, which the second width is less than the first width.

20 Claims, 11 Drawing Sheets

(56) References Cited

U.S. PATENT DOCUMENTS

| | | | |
|---|---|---|---|
| 2011/0210393 A1* | 9/2011 | Chen | H01L 21/823431 257/347 |
| 2014/0273365 A1* | 9/2014 | Wei | H01L 21/823821 438/199 |
| 2015/0035023 A1* | 2/2015 | Kim | H01L 29/785 257/288 |
| 2015/0255543 A1* | 9/2015 | Cheng | H01L 29/7848 257/288 |

* cited by examiner

SEMICONDUCTOR STRUCTURE AND FABRICATING METHOD THEREOF

BACKGROUND

Manufacturing of an integrated circuit (IC) has been largely driven by the need to increase the density of the integrated circuit formed in a semiconductor device. This is typically accomplished by implementing more aggressive design rules to allow larger density of IC device to be formed. Nonetheless, the increased density of the IC devices, such as transistors, has also increased the complexity of processing semiconductor devices with the decreased feature sizes.

For example, as semiconductor devices, such as fin field effect transistor (FinFET), is scaled down through various technology nodes, strained source/drain features (e.g., stressor regions) have been implemented using epitaxial (epi) semiconductor materials to enhance carrier mobility and improve device performance. Forming a FinFET with stressor regions often implements epitaxially grown silicon (Si) to form raised source and drain features for an n-type device, and epitaxially growing silicon germanium (SiGe) to form raised source and drain features for a p-type device. In the manufacturing process of stressors, further improvements are constantly necessary to satisfy the performance requirement in the scaling down process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
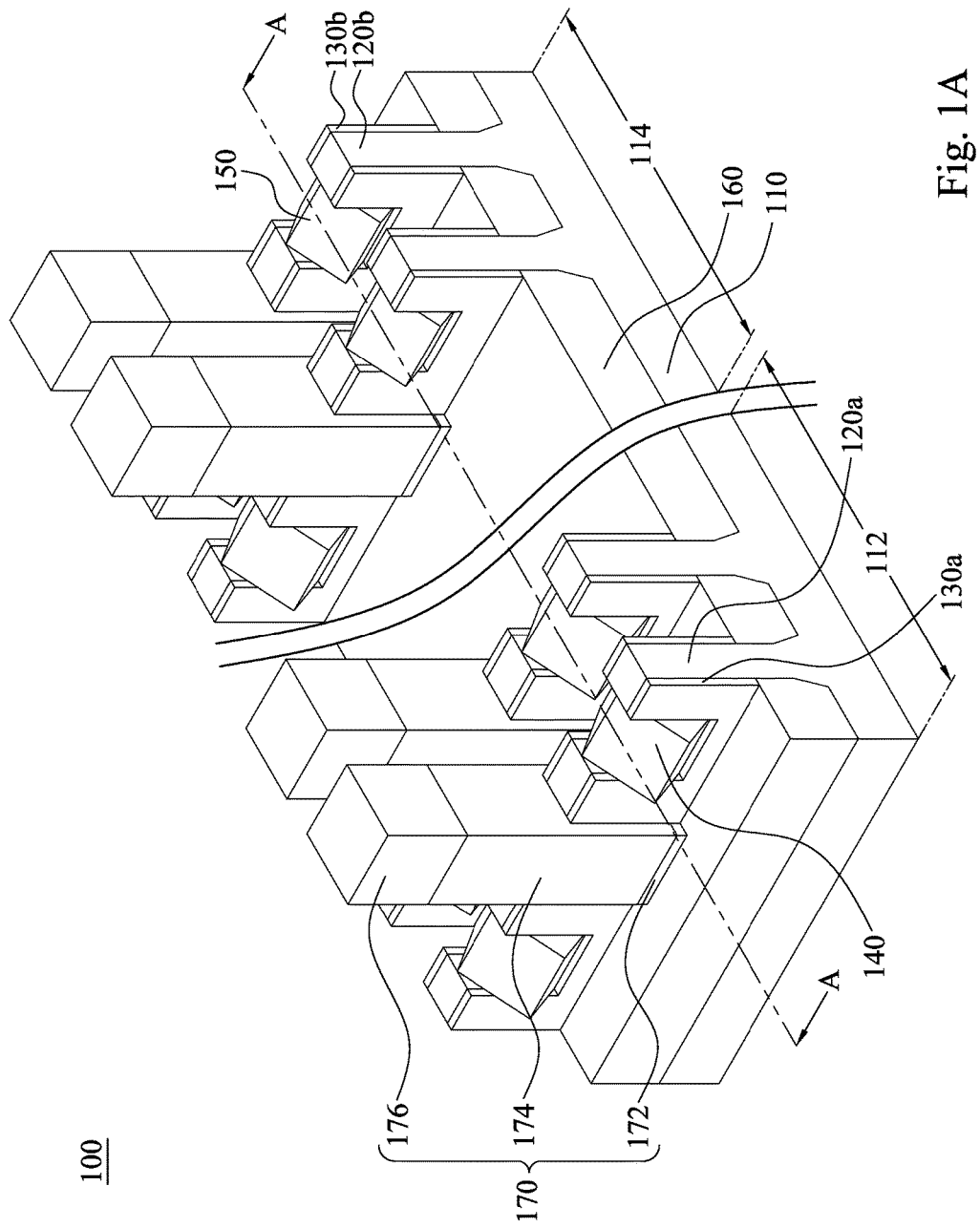
FIG. 1A is a semiconductor structure in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor structure usually includes a device region and a test region, and epitaxy structures having the same volume are simultaneously fabricated in fin structures of the device region and the test region. Generally, the epitaxy structures in the device region are desired to have larger volume, which may be even achieved by merging two adjacent epitaxy structures, so as to increase performance of the semiconductor structure. However, the merged epitaxy structure in the test region decreases yield of the semiconductor structure. In this concern, a semiconductor structure and a fabricating method thereof are necessary to fabricate epitaxy structures having different volumes to satisfy the desire of the device region and the test region.

Figure 1B:
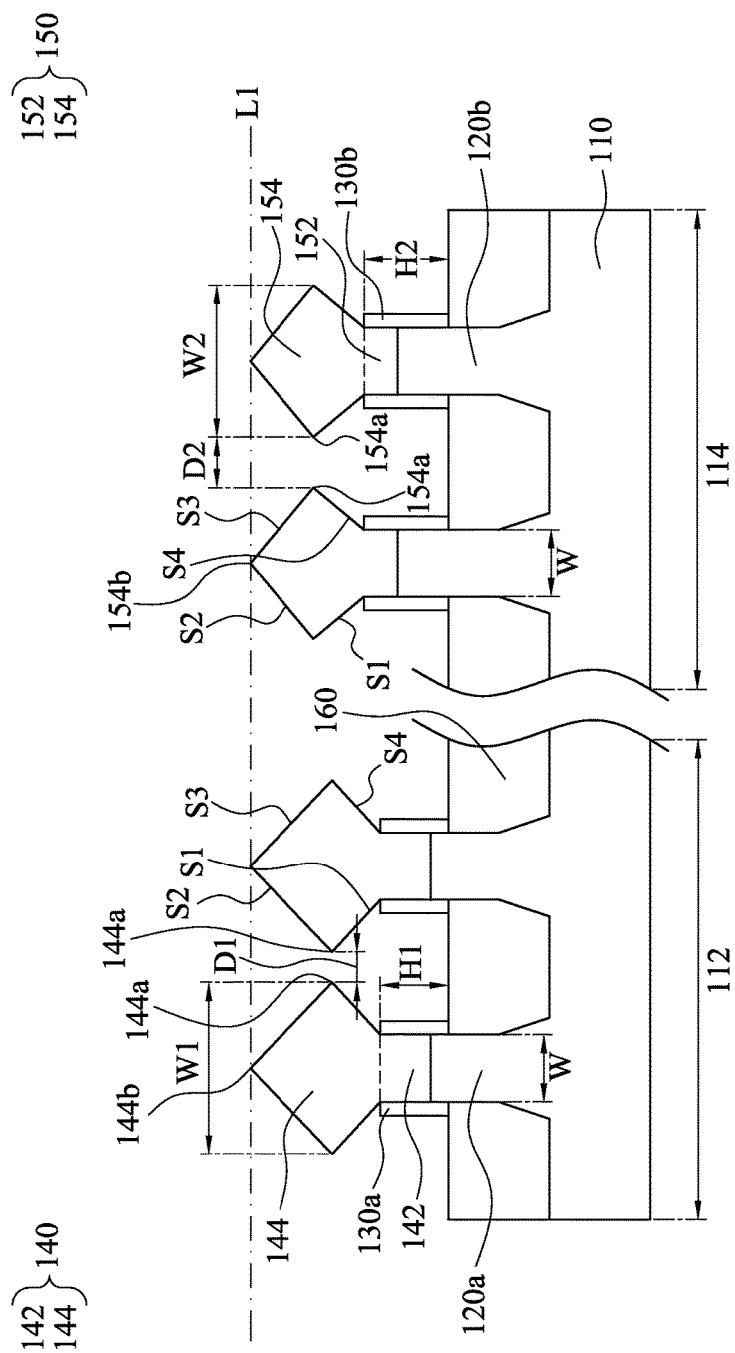
FIG. 1B is a cross-sectional view of the semiconductor structure in FIG. 1A along the line AA, in accordance with various embodiments.

FIG. 1A is a semiconductor structure in accordance with various embodiments of the present disclosure, and FIG. 1B is a cross-sectional view of the semiconductor structure in FIG. 1A along the line AA, in accordance with various embodiments. A semiconductor structure 100 is described in FIGS. 1A and 1B, which may include passive components such as resistors, capacitors, inductors, and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and/or combinations thereof. It is further understood that additional features may be added in the semiconductor structure 100, and some of the features described below may be replaced or eliminated, for additional embodiments of the semiconductor structure 100.

As shown in FIGS. 1A and 1B, the semiconductor structure 100 includes a substrate 110, a first fin structure 120a, a second fin structure 120b, first fin spacers 130a, second fin spacers 130b, a first epitaxy structure 140 and a second epitaxy structure 150. The first fin structure 120a and the second fin structure 120b are formed from the substrate 110, which the first fin structure 120a is disposed in a device region 112 of the substrate 110, and the second fin structure 120b is disposed in a test region 114 of the substrate 110. In some embodiments, the substrate 110 may include an elementary semiconductor including silicon or germanium in crystal, polycrystalline, and/or an amorphous structure. In various embodiments, the substrate 110 may include a compound semiconductor including silicon carbide, gallium arsenic, gallium phosphide, indium phosphide, indium arsenide, and/or indium antimonide. In various embodiments, the substrate 110 may include an alloy semiconductor including SiGe, GaAsP, AlInAs, AlGaAs, GaInAs, GaInP, and/or GaInAsP; any other suitable material; and/or combinations thereof.

In some embodiments, the semiconductor structure 100 further includes an isolation structure 160 disposed between the two adjacent ones of the first fin structures 120a or the two adjacent ones of the second fin structures 120b. In other words, the isolation structure 160 separates and electrically isolates the adjacent fin structures. In various embodiments, the isolation structure 160 is a shallow trench isolation (STI) structure including silicon oxide, silicon nitride, spin-on glass, combination thereof, or other suitable material.

The first fin spacers 130a the sidewalls of the first fin structure 120a, and the second fin spacers 130b cover sidewalls of the second fin structure 120b. In some embodiments, first fin spacers 130a and the second fin spacers 130b are further extended to cover a top surface of the isolation structure 160. In some embodiments, the first fin spacers 130a and the second fin spacers 130b may include silicon nitride, SiC, SiON, or combinations thereof.

As shown in FIG. 1A, a portion of the first fin structures 120a and a portion of the first fin spacers 130a are recessed, and the first epitaxy structure 140 is disposed in the recessed portion of the first fin structure 120a. Similarly, a portion of the second fin structures 120b and a portion of the second fin spacers 130b are recessed, and the second epitaxy structure 150 is disposed in the recessed portion of the second fin structure 120b.

In some embodiments, the first epitaxy structure 140 and the second epitaxy structure 150 include silicon, silicon germanium or a combination thereof. For example, the semiconductor structure 100 is a N-channel field effect transistor (NFET) device, and the first epitaxy structure 140 and the second epitaxy structure 150 are formed of silicon to increase the strain, resulting in higher electron mobility during operation of the NFET device. In another example, the semiconductor structure 100 is a P-channel field effect transistor (PFET) device, and the first epitaxy structure 140 and the second epitaxy structure 150 are formed of silicon germanium to increase the strain, resulting in higher hole mobility during operation of the PFET device.

FIG. 1B shows relationships of the first fin structures 120a, the second fin structures 120b, the first fin spacers 130a, the second fin spacers 130b, the first epitaxy structure 140 and the second epitaxy structure 150 in the recessed portions. In FIG. 1B, each of the first fin spacers 130a has a first height H1 above the isolation structure 160, and the first epitaxy structures 140a are respectively disposed in the first fin structures 120a. Specifically, in the device region 112, the first epitaxy structure 140 has a first portion 142 interposed between the two first fin spacers 130a, and a width of the first portion 142 is the same as a width W of the first fin structure 120a. A second portion 144 of the first epitaxy structure 140 is above the first fin spacers 130a, which the second portion 144 is expanded horizontally to gradually increase the width W to a first width W1. In other words, the second portion 144 of the first epitaxy structure 140 is above the first fin spacers 130a and has a first width W1 greater than the width of the width W of the first fin structure 120a. In addition, a first proximate distance D1 is between the two adjacent first epitaxy structures 140, which the first proximate distance D1 is defined as a distance between two nearest vertexes 144a of the two adjacent first epitaxy structures 140.

In the test region 114, each of the second fin spacers 130b has a second height H2 above the isolation structure 160, the second height H2 being greater than the first height H1, and the second epitaxy structures 150 are respectively disposed in the second fin structures 120b. Specifically, the second epitaxy structure 150 has a first portion 152 interposed between the two second fin spacers 130b, and a width of the first portion 152 is the same as the width W of the second fin structure 120b. A second portion 154 of the second epitaxy structure 140 is above the second fin spacers 130b, which the second portion 154 is expanded horizontally to gradually increase the width W to a second width W2. In other words, the second portion 154 of the second epitaxy structure 150 is above the second fin spacers 130b and has the second width W2 greater than the width of the width W of the second fin structure 120b. In addition, a second proximate distance D2 is between the two adjacent second epitaxy structures 150, which the second proximate distance D2 is defined as a distance between two nearest vertexes 154a of the two adjacent second epitaxy structures 150.

In various embodiments, the semiconductor structure 100 further includes cap layers respectively on the first epitaxy structure 140 and the second epitaxy structure 150 to protect them from damage during the subsequent exposing and etching process. In some embodiments, the first epitaxy structure 140, the second epitaxy structure 150 and the cap layers are formed of the silicon germanium, which the silicon germanium of the cap layers have a germanium percentage in a range from about 0 to about 30%, and the silicon germanium of the first epitaxy structure 140 and the second epitaxy structure 150 have a germanium percentage greater than about 30%.

It is worth noting that the values of the first proximate distance D1 and the second proximate distance D2 are respectively determined by the first height H1 of the first fin spacer 130a and the second height H2 of the second fin spacer 130b, and the reasons are described below. Above the first fin spacer 130a or the second fin spacer 130b, the second portion 144 or 154 of the first epitaxy structure 140 or the second epitaxy structure 150 start to expand horizontally and form facets, and a top 144b of the first epitaxy structure 140 and a top 154b of the second epitaxy structure 150 are on the same level L1. Since the second height H2 is greater than the first height H1, the second portion 144 of the first epitaxy structure 140 is greater than the second portion 154 of the second epitaxy structure 150 in thickness. As such, the second portion 154 of the second epitaxy structure 150 is expanded horizontally to a volume less than that of the second portion 144 of the first epitaxy structure 140, and the second width W2 of the second portion 154 is less than the first width W1 of the second portion 144.

In some embodiments, the first width W1 is extended on a level different from that of the second width W2. In various embodiments, the first width W1 is extended on a level lower than that of the second width W2.

In addition, as shown in FIG. 1B, the second portion 144 of the first epitaxy structure 140 with the greater first width W1 reduces the space between the two adjacent first epitaxy structures 140. Therefore, the second proximate distance D2 between the two adjacent second epitaxy structures 150 is greater than the first proximate distance D1 between the two adjacent first epitaxy structures 140, and the two adjacent second epitaxy structures 150 in the test region 114 are not in contact with each other to increase the yield of the semiconductor structure 100. In some embodiments, the second proximate distance D2 is in a range from about 5 nm to about 25 nm. In various embodiments, the two adjacent first epitaxy structures 140 in the device region 114 are not in contact with each other.

In some embodiments, the second portion 144 of the first epitaxy structure 140 and the second portion 154 of the second epitaxy structure 150 are diamond shaped. In various embodiments, each of the second portion 144 of the first epitaxy structure 140 and the second portion 154 of the second epitaxy structure 150 has four facets, S1, S2, S3 and S4. Each facet has a (111) crystallographic orientation. In various embodiments, the facet S1 is parallel to the facet S3 and the facet S2 is parallel to the facet S4. The facets S1 and S4 have a fixed angle α with the top of the fin spacer 130a or 130b, and the facets S2 and S4 have a fixed angle β with a direction parallel with the top of the fin spacer 130a or 130b. As an example, fixed angle α is 54.7 degrees as well as the fixed angle β.

The semiconductor structure 100 further includes gate structures 170 respectively on and across the first fin structure 120a and the second fin structure 120b. In some embodiments, the gate structure 170 includes, in order, a gate dielectric layer 172, a gate electrode 174, and a hard mask 176. The gate dielectric layer 172 is disposed on the first fin structure 120a or the second fin structure 120b and includes a dielectric material, such as silicon oxide, silicon oxynitride, silicon nitride, a high-k dielectric material, other suitable dielectric material, or combinations thereof. Exemplary high-k dielectric materials include $HfO_2$, HfSiO, HfSiON, HfTaO, HfTiO, HfZrO, other suitable materials, or a combination thereof.

In various embodiments, the gate dielectric layer 172 is a multilayer structure, for example, including an interfacial layer, and a high-k dielectric material layer on the interfacial layer. An exemplary interfacial layer may be a grown silicon oxide layer formed by a thermal process or an atomic layer deposition (ALD) process.

The gate electrode 174 is disposed on the gate dielectric layer 172. In some embodiments, the gate electrode 174 is formed of polycrystalline silicon (polysilicon), and the polysilicon is doped for proper conductivity. Alternatively, the polysilicon is not necessarily doped if a dummy gate is to be formed and replaced in a subsequent metal gate replacement process. In various embodiments, the gate electrode 174 includes conductive materials having a proper work function, which is also referred as a work function layer. The work function layer includes any suitable material, such that the layer is tuned to have a proper work function for enhanced performance of the associated device. For example, if a p-type work function metal for the PFET device is desired, TiN or TaN is used to prepare the work function layer. On the other hand, if an n-type work function metal for the NFET device is desired, Ta, TiAl, TiAlN, or TaCN is used to prepare the work function layer. In various embodiments, the gate electrode 174 includes other conductive materials, such as aluminum, copper, tungsten, metal alloys, metal silicide, other suitable materials, or a combination thereof. Specifically, the gate electrode 174 includes the work function layer and another conductive layer on the work function layer.

The hard mask 176 is disposed on and protecting the gate electrode 174. In some embodiments, the hard mask 176 includes silicon oxide, silicon nitride, silicon oxynitride, silicon carbide, other suitable dielectric material, or combinations thereof. In various embodiments, the hard mask 176 is a multi-layer structure.

Figure 2A:
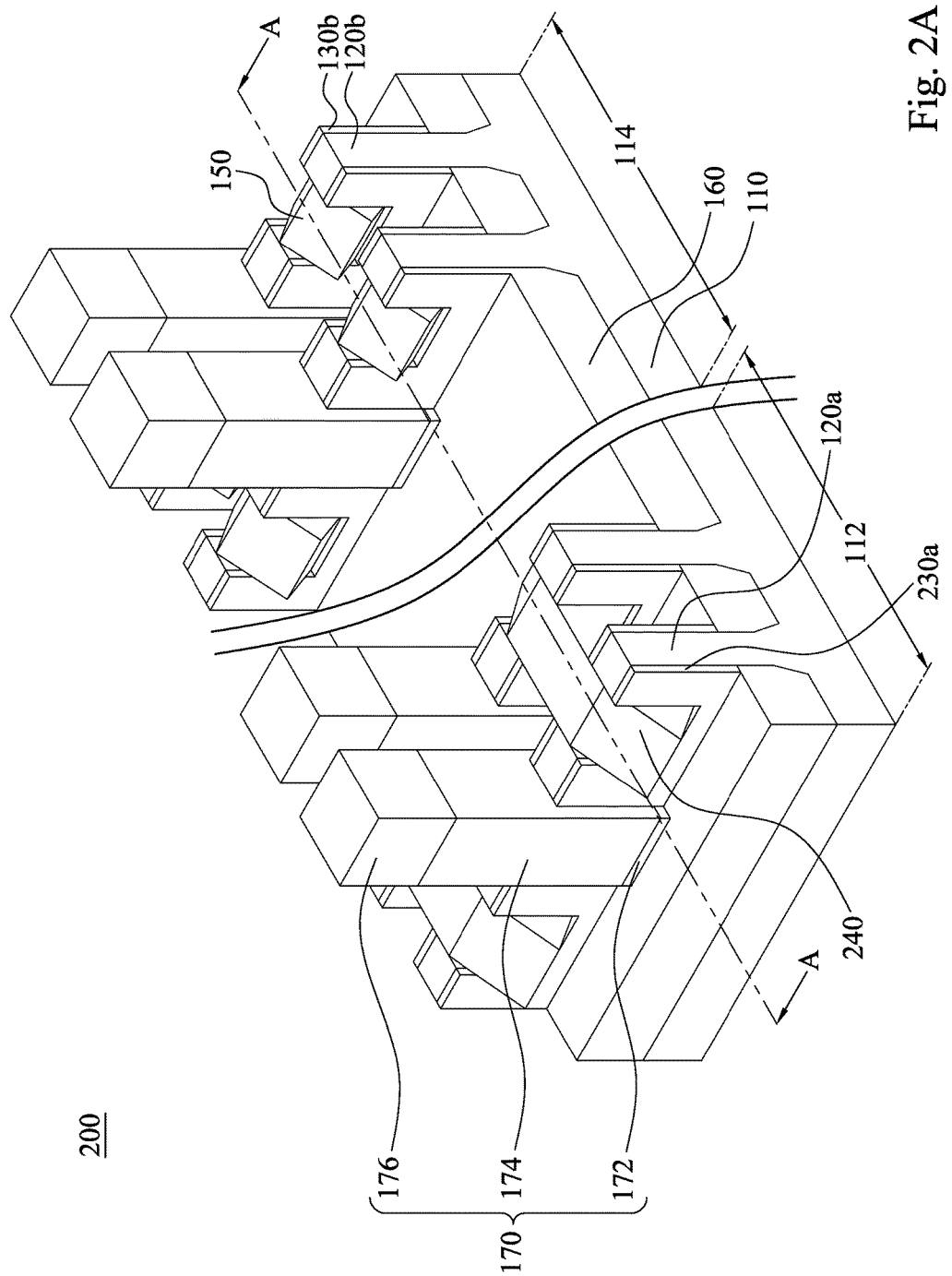
FIG. 2A is a semiconductor structure in accordance with various embodiments of the present disclosure.
Figure 2B:
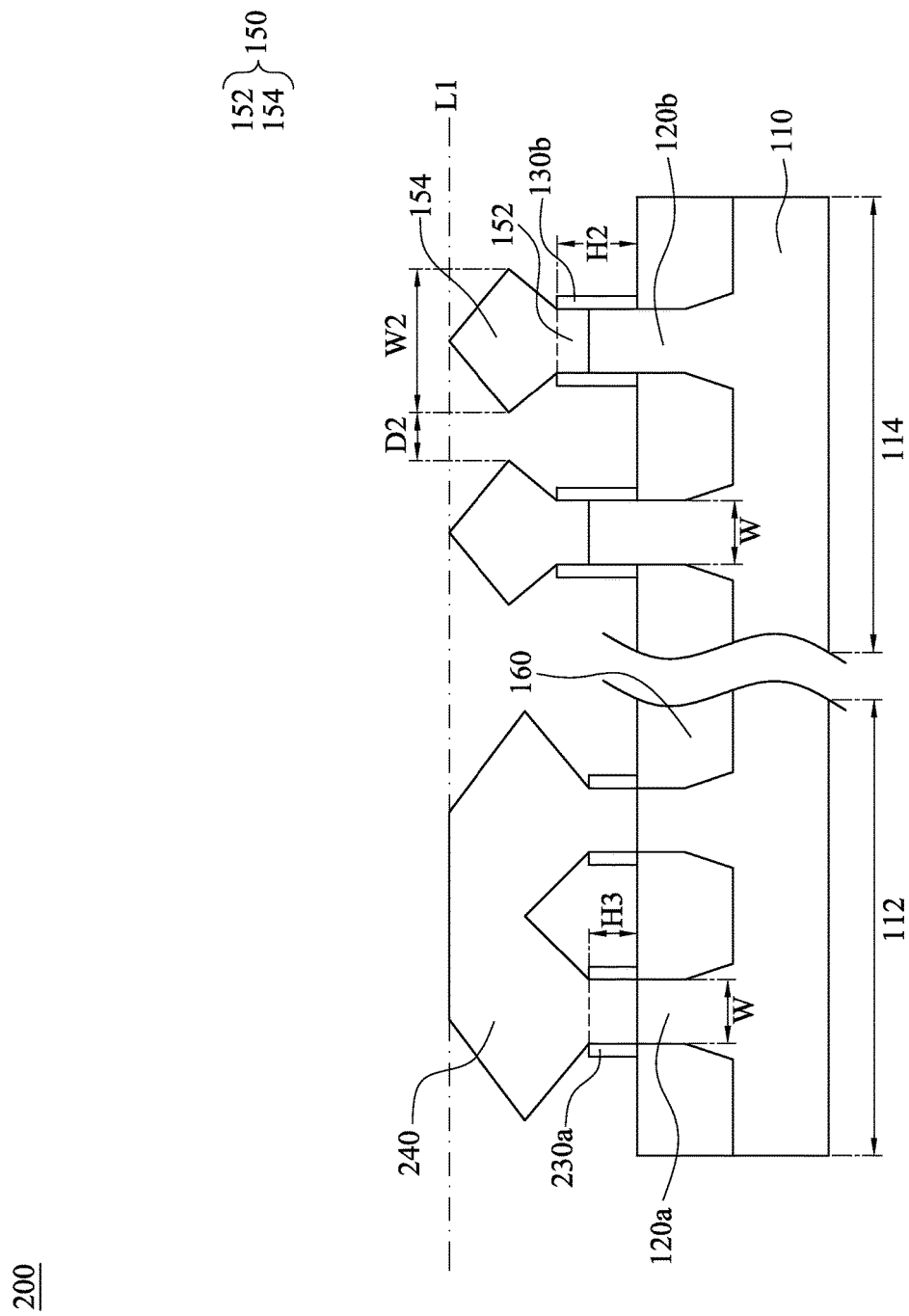
FIG. 2B is a cross-sectional view of the semiconductor structure in FIG. 2A along the line AA, in accordance with various embodiments.

Referring now to FIG. 2A and FIG. 2B. FIG. 2A is a semiconductor structure in accordance with various embodiments of the present disclosure, and FIG. 2B is a cross-sectional view of the semiconductor structure in FIG. 2A along the line AA, in accordance with various embodiments.

The difference between the semiconductor structure 100 in FIGS. 1A and 1B and the semiconductor structure 200 in FIGS. 2A and 2B are described below. First fin spacers 230a in FIG. 2B have a third height H3, which is less than the first height H1 of the first fin spacers 130a shown in FIG. 1B. As aforementioned in FIG. 1B, the second portion 144 of the first epitaxy structure 140 starts to expand horizontally above the first fin spacer 130a and form the facets S1, S2, S3 and S4, and the value of the first proximate distance D1 between the two adjacent first epitaxy structures 140 is determined by the height of the of the first fin spacers 130a. Since the third height H3 of the first fin spacers 230a is less than the first height H1 of first fin spacers 130a, the second portion 144 of first epitaxy structure 140 is expand horizontally to form a width greater than the first width W1, and thus shortens the first proximate distance D1. When the first proximate distance D1 is less than zero, the two adjacent first epitaxy structures 140 in the device region 112 are in contact with each other and merged into a merged epitaxy structure 240, which has larger volume and thus increase the performance of the semiconductor structure 200. To be noticed, the two adjacent second epitaxy structures 150 in the test region 114 are still separated by the second proximate distance D2 to increase the yield of the semiconductor structure 200.

According to some embodiments, a method of fabricating a semiconductor structure 100 is provided. FIG. 3A to 3E are cross-sectional views of the semiconductor structure 100 in FIG. 1A along the line AA at an intermediate stage of fabrication, in accordance with various embodiments. It worthy noting that additional steps may be provided before, during, and/or after the method, and some of the steps described below may be replaced or eliminated, for additional embodiments of the method.

Figure 3A:
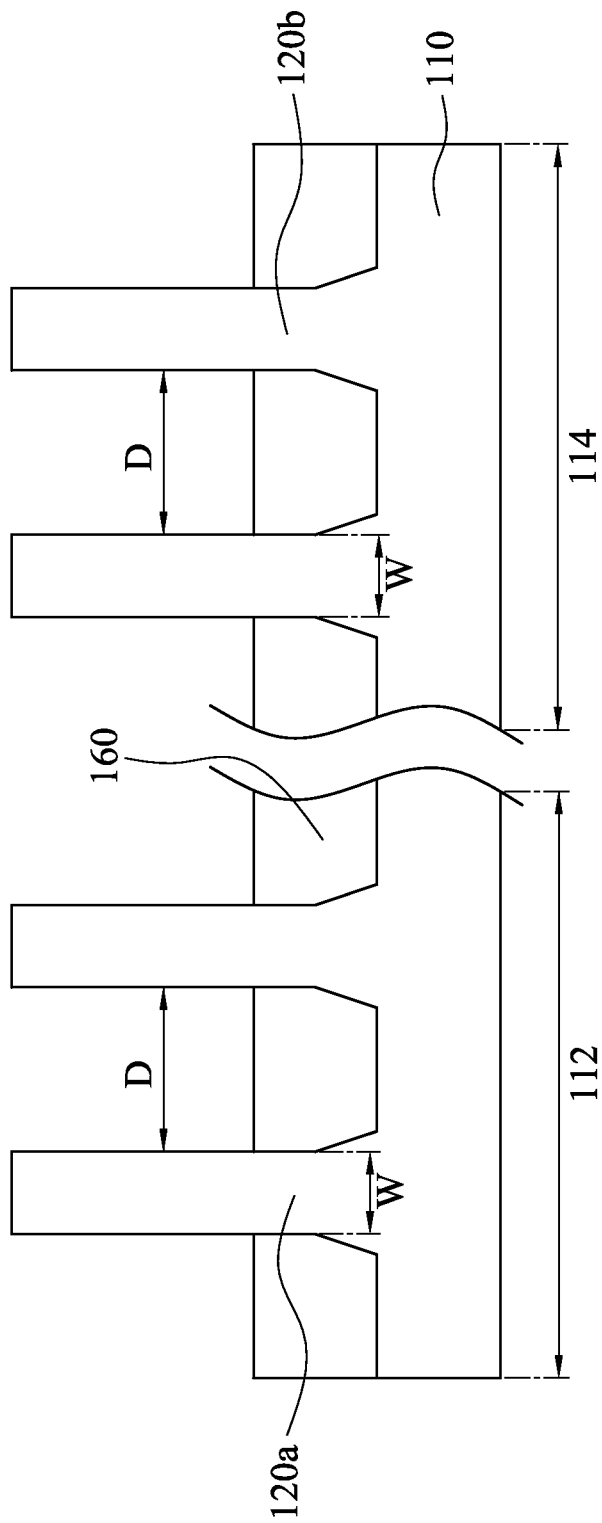
FIGS. 3A to 3E are cross-sectional views of the semiconductor structure in FIG. 1A along the line AA at an intermediate stage of fabrication, in accordance with various embodiments.

In FIG. 3A, a first fin structure 120a and a second fin structure 120b are formed from a substrate 110. The substrate 110 includes a device region 112 and a test region 114, which the first fin structure 120a is in the device region 112, and the second fin structure 120b is in the test region 114. In addition, the first fin structure 120a and the second fin structure 120b both have a width W, and a distance D is between the adjacent first fin structures 120a or the adjacent second fin structures 120b.

In some embodiments, the first fin structure 120a and the second fin structure 120b may be fabricated using suitable processes including photolithography and etch processes. The photolithography process may include forming a photoresist layer (not shown) overlying the substrate 110, exposing the photoresist layer to form a pattern, performing post-exposure bake processes, and developing the pattern to form a masking element. The masking element mentioned above is used to protect portions of the substrate 110 while forming trenches in the substrate 110 by the etching process, leaving the extending first fin structure 120a and the second fin structure 120b.

In various embodiments, an isolation structure 160 is formed between the adjacent first fin structures 120a and the adjacent second fin structures 120b. In some embodiments, trenches are formed by using reactive ion etch (RIE) and/or other suitable etching processes, and an isolating material, such as silicon oxide, silicon nitride, spin-on glass, combination thereof, or other suitable material are filled in these trenches. Then, a chemical mechanical polish (CMP) process is performed to remove excess isolating material. Other techniques for fabricating the isolation structure 160 are possible.

In various embodiments, gate structures 170 shown in FIG. 1A are formed respectively on and across the first fin structure 120a and the second fin structure 120b. In this step, a gate dielectric layer 172, a gate electrode 174, and a hard mask 176 are subsequently formed on the first fin structure 120a and the second fin structure 120b by a deposition process, such as chemical vapor deposition (CVD), physical vapor deposition (PVD), atomic layer deposition (ALD), thermal oxidation, other suitable techniques, or a combination thereof. Then, the gate dielectric layer 172, the gate electrode 174, and the hard mask 176 are patterned to form the gate structure 170 covering a top surface and sidewalls of the first fin structure 120a and the second fin structure 120b. In other words, the top surface and the sidewalls of the first fin structure 120a and the second fin structure 120b function as a channel when a voltage is applied to the gate structure 170.

In some embodiments, the patterning process further includes lithography process and etching process. The lithography process includes photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching).

Figure 3B:
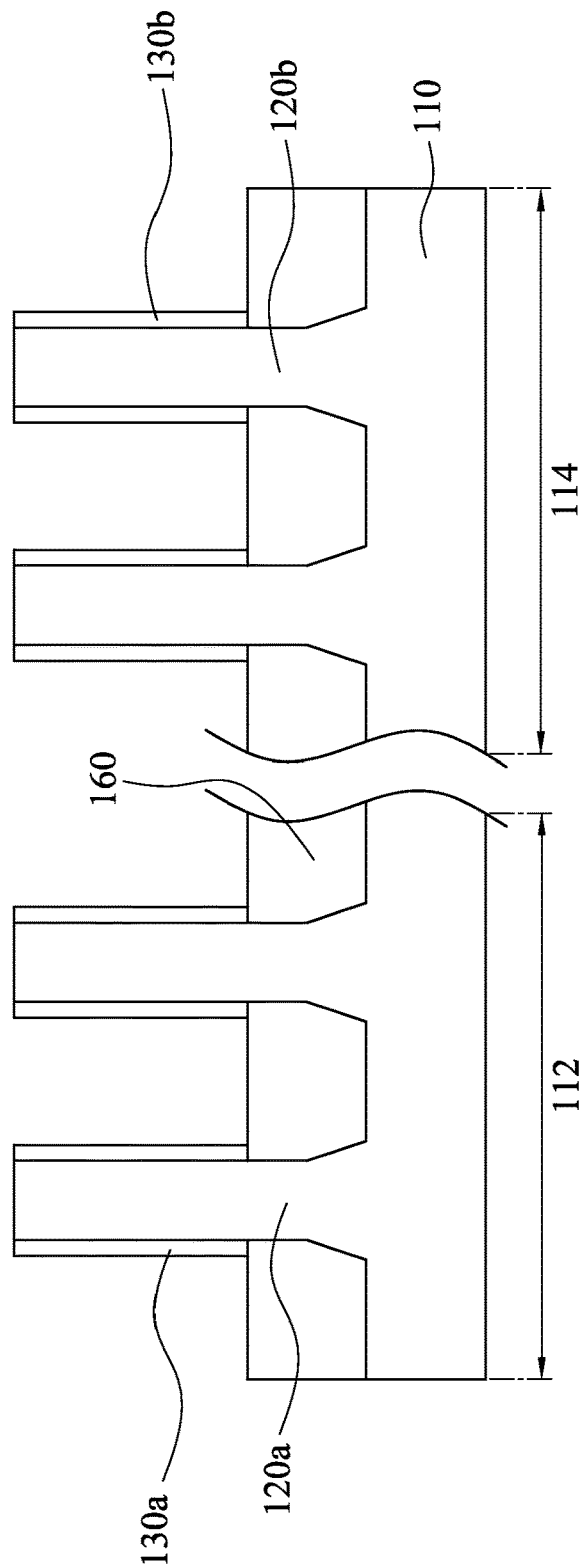

In FIG. 3B, first fin spacers 130a are covered on sidewalls of the first fin structure 120a, and the second fin spacers 130b are covered on sidewalls of the second fin structure 120b. In some embodiments, the first fin spacers 130a and the second fin spacers 130b are formed by conformally covering a dielectric material on the first fin structure 120a, the second fin structure 120b and the isolation structure 160. Then, the dielectric material above the first fin structure 120a and the second fin structure 120b is etched to remain the first fin spacers 130a and the second fin spacers 130b respectively on sidewalls of the first fin structure 120a and the second fin structure 120b. The etching process may include a multiple-step etching to gain etch selectivity, flexibility and desired overetch control.

Figure 3C:
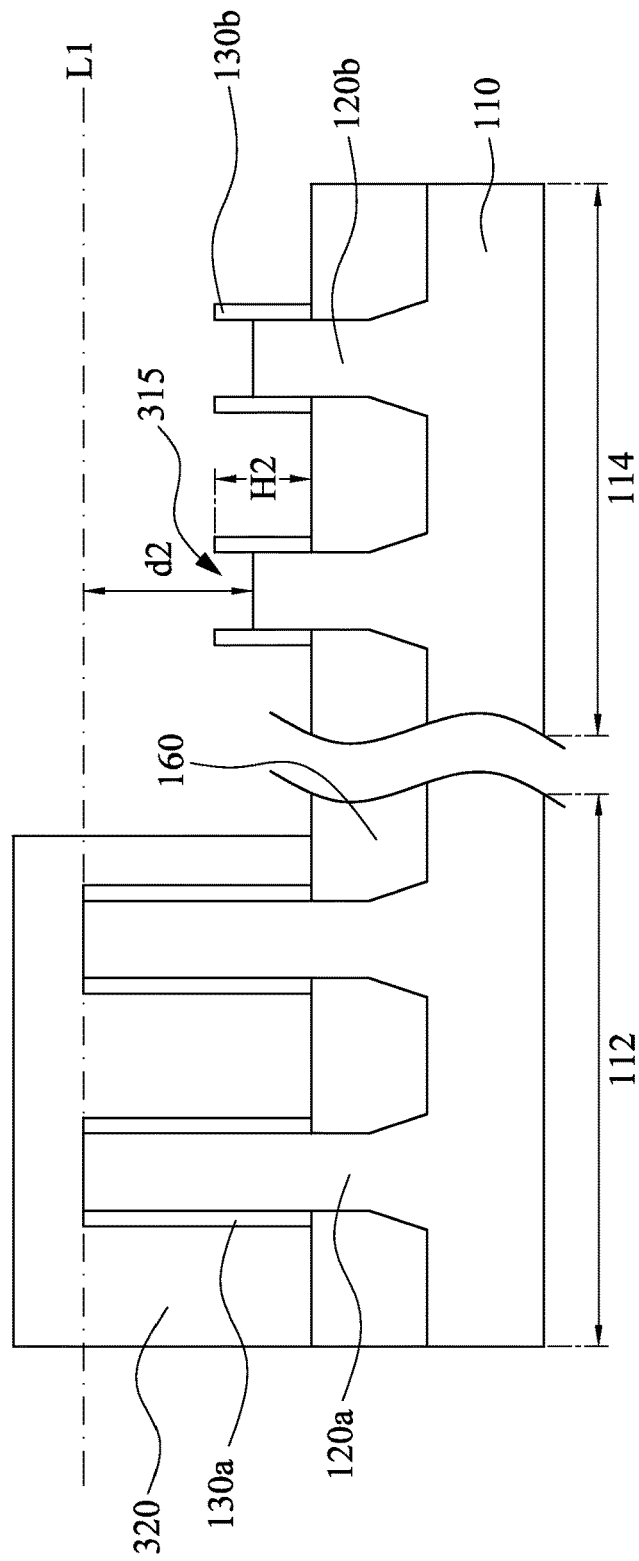

In FIG. 3C, the second fin structure 120b and the second fin spacer 130b are recessed to form a second recess 315 having a depth d2 in the second fin structure 120b. Specifically, a top surface of the second fin structure 120b is on a level L1 before recessing, and then the top surface is recessed to a level lower than the level L1, which the depth d2 is defined as a distance between a bottom of the recess 315 and the level L1. In this step, a first photoresist 320 is applied to protect the device region 112, and the second fin structure 120b and the second fin spacer 130b in the test region 114 are simultaneously recessed by an selective etching process in a second period of time T2, which a removing rate of the second fin structure 120a is greater than a removing rate of the second fin spacer 130b. Therefore, a height of the second fin structure 120b above the isolation structure 160 is lower than a second height H2 of the second fin spacer 130b after the recessing process.

In some embodiments, the selective etching process is a dry etching process or a wet etching process using suitable solvents or plasma gases. In various embodiments, the removing rate of the second fin structure 120a is in a range from about 1.5 to about 2 times of the removing rate of the second fin spacer 130b.

Figure 3D:
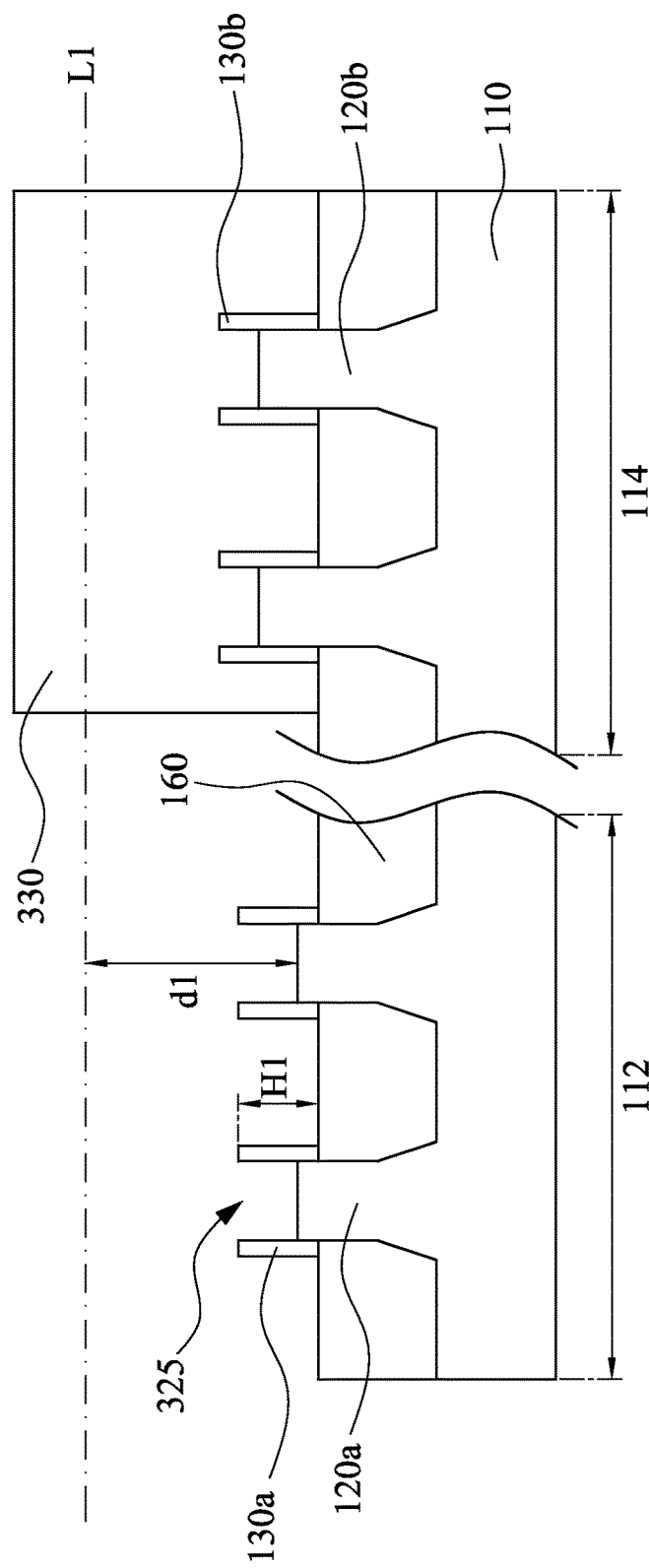

In FIG. 3D, the first fin structure 120a and the first fin spacer 130a are recessed to form a first recess 325 having a depth d1 in the first fin structure 120a. Similarly, a top surface of the first fin structure 120a is on a level L1 before recessing, and then the top surface is recessed to a level lower than the level L1, which the depth d1 is defined as a distance between a bottom of the recess 325 and the level L1. In this step, a second photoresist 330 is applied to protect the test region 114, and the first fin structure 120a and the first fin spacer 130a in the device region 112 are simultaneously recessed by an selective etching process in a first period of time T1, which a removing rate of the first fin structure 120a is greater than a removing rate of the first fin spacer 130a. Therefore, a height of the first fin structure 120a above the isolation structure 160 is lower than a first height H1 of the first fin spacer 130a after the recessing process.

In some embodiments, the selective etching process is a dry etching process or a wet etching process using suitable solvents or plasma gases. In various embodiments, the removing rate of the first fin structure 120a is in a range from about 1.5 to about 2 times of the removing rate of the first fin spacer 130a.

It is worth noting that the first period of time T1 is longer than the second period of time T2. Specifically, the first fin spacer 130a and the second fin spacer 130b have the same height before recessing, which the height of the first fin spacer 130a is recessed to the first height H1 during the first period of time T1, and the height of the second fin spacer 130b is recessed to the second height H2 during the second period of time T2. Since the first period of time T1 is longer than the second period of time T2, the second height H2 of the second fin spacer 130b is greater than the first height H1 of the first fin spacer 130a. The first height H1 and the second height H2 are designed to achieve target dimensions of a subsequent epitaxial structure, which will be described in details later.

Similarly, the first fin structure 120a and the second fin structure 120b has the same height before recessing, which the first fin structure 120a is recessed to form the recess 325 having the depth d1 during the first period of time T1, and second fin structure 120b is recessed to form the recess 315 having the depth d2 during the second period of time T2. Since the first period of time T1 is longer than the second period of time T2, the depth d2 of the recess 315 is less than the depth d1 of the first recess 325.

Figure 3E:
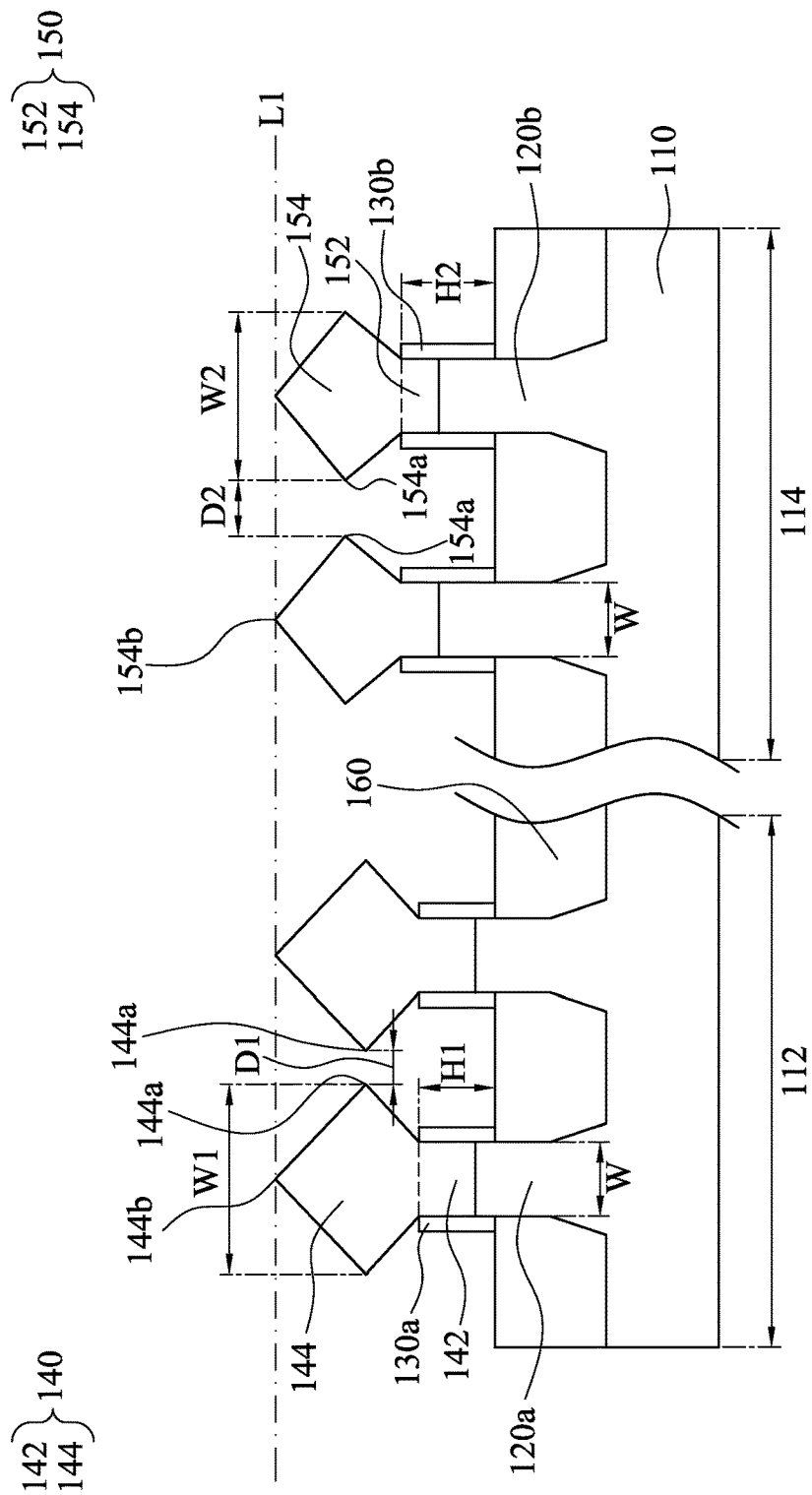

In FIG. 3E, a first epitaxy structure 140 and a second epitaxy structure 150 are grown respectively in and filled the recesses 315 and 325. In some embodiments, the first epitaxy structure 140 and the second epitaxy structure 150 are simultaneously grown by an epitaxy process including a Si-containing gas (e.g., silane or dichlorosilane (DCS)), a Ge-containing gas (e.g., $GeH_4$, $GeCl_4$), a carrier gas (e.g., $H_2$), and/or a selective etching gas (e.g., HCl). The epitaxy process is performed under a temperature ranging between about 500° C. and about 800° C., and under a pressure ranging between about 10 Torr and about 100 Torr.

Specifically, the first fin spacer 130a function as a barrier to constrain the first epitaxy structure 140 to grow between the two first fin spacers 130a and form a first portion 142 of the first epitaxy structure 140, and a width of the first portion 142 is the same as a width W of the first fin structure 120a. Then, the first epitaxy structure 140 starts to expand horizontally above the first fin spacer 130a to gradually increase the width W to a first width W1, and thus forming a second portion 144 of the first epitaxy structure 140. In addition, a first proximate distance D1 is formed between the two adjacent first epitaxy structures 140, which the first proximate distance D1 is defined as a distance between two nearest vertexes 144a of the two adjacent first epitaxy structures 140.

Similarly, the second fin spacer 130b function as a barrier to constrain the second epitaxy structure 150 to grow between the two second fin spacers 130b and form a first portion 152 of the second epitaxy structure 150. Then, the second epitaxy structure 150 starts to expand horizontally above the second fin spacer 130b to gradually increase the width W to a second width W2, and thus forming a second portion 154 of the second epitaxy structure 150. In addition, a first proximate distance D2 is between the two adjacent second epitaxy structures 150, which the first proximate distance D2 is defined as a distance between two nearest vertexes 154a of the two adjacent second epitaxy structures 150.

As discussed in FIGS. 1A and 1B, the values of the first proximate distance D1 and the second proximate distance D2 are respectively determined by the first height H1 of the first fin spacer 130a and the second height H2 of the second fin spacer 130b. Since the second height H2 is greater than the first height H1, the second portion 144 of the first epitaxy structure 140 is greater than the second portion 154 of the second epitaxy structure 150 in thickness. As such, the second portion 154 of the second epitaxy structure 150 is expanded horizontally to a volume less than that of the second portion 144 of the first epitaxy structure 140, so the second width W2 of the second portion 154 is less than the first width W1 of the first portion 142. Smaller second width W2 enlarges the second proximate distance D2 between the two adjacent second epitaxy structures 150, so the second proximate distance D2 is greater than the first proximate distance D1. Furthermore, the second proximate distance D2 having a greater value ensures that the two adjacent second epitaxy structures 150 in the test region 114 are not in contact with each other, and thus increases the yield of the semiconductor structure 100. On the other hand, the first epitaxy structures 140 in the device region 112 maintain larger volume to increase the performance of the semiconductor structure 100.

In some embodiments, cap layers are respectively formed on the first epitaxy structure 140 and second epitaxy structure 150 to protect them from damage during the subsequent exposing and etching process. In some embodiments, the first epitaxy structure 140, the second epitaxy structure 150 and the cap layers are formed of the silicon germanium, which the silicon germanium of the cap layers have a germanium percentage in a range from about 0 to about 30%, and the silicon germanium of the first epitaxy structure 140 and the second epitaxy structure 150 have a germanium percentage greater than about 30%.

Figure 4A:
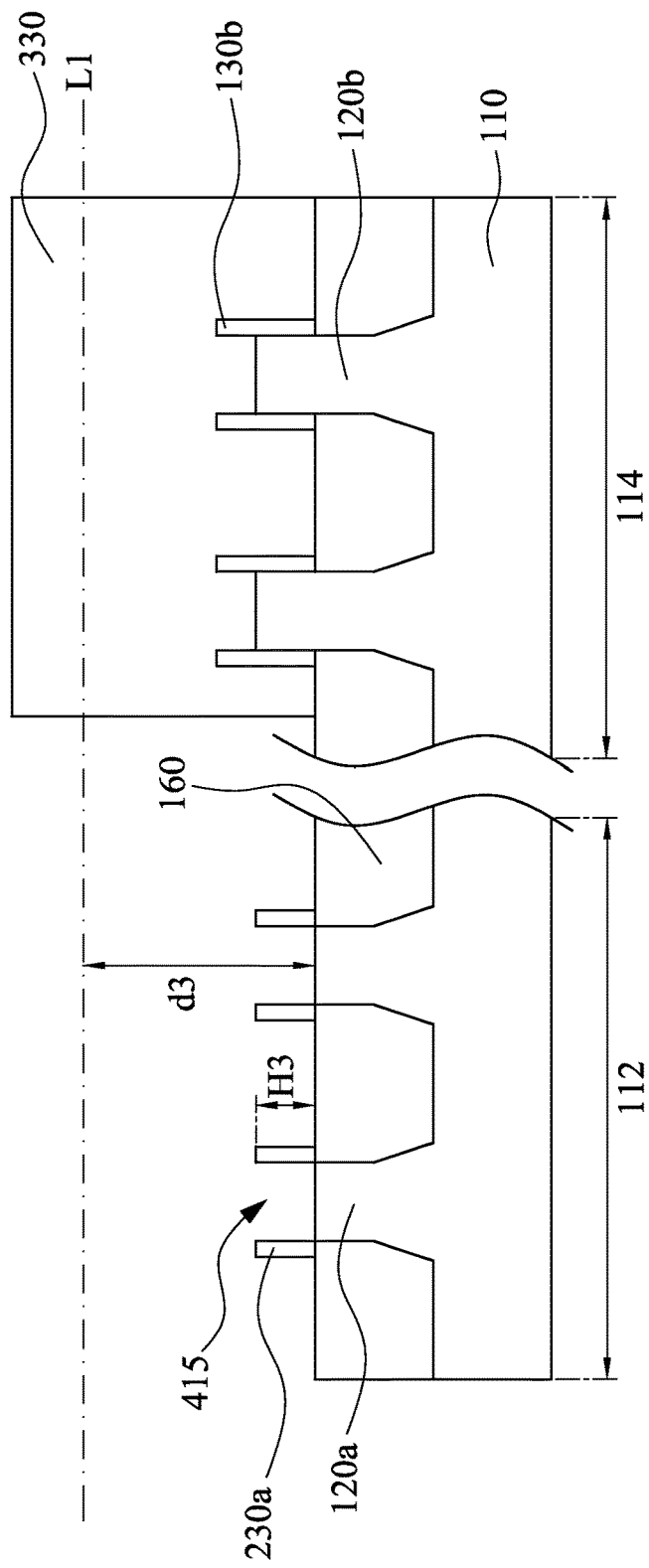
FIGS. 4A and 4B are cross-sectional views of the semiconductor structure in FIG. 2A along the line AA at an intermediate stage of fabrication, in accordance with various embodiments.
Figure 4B:
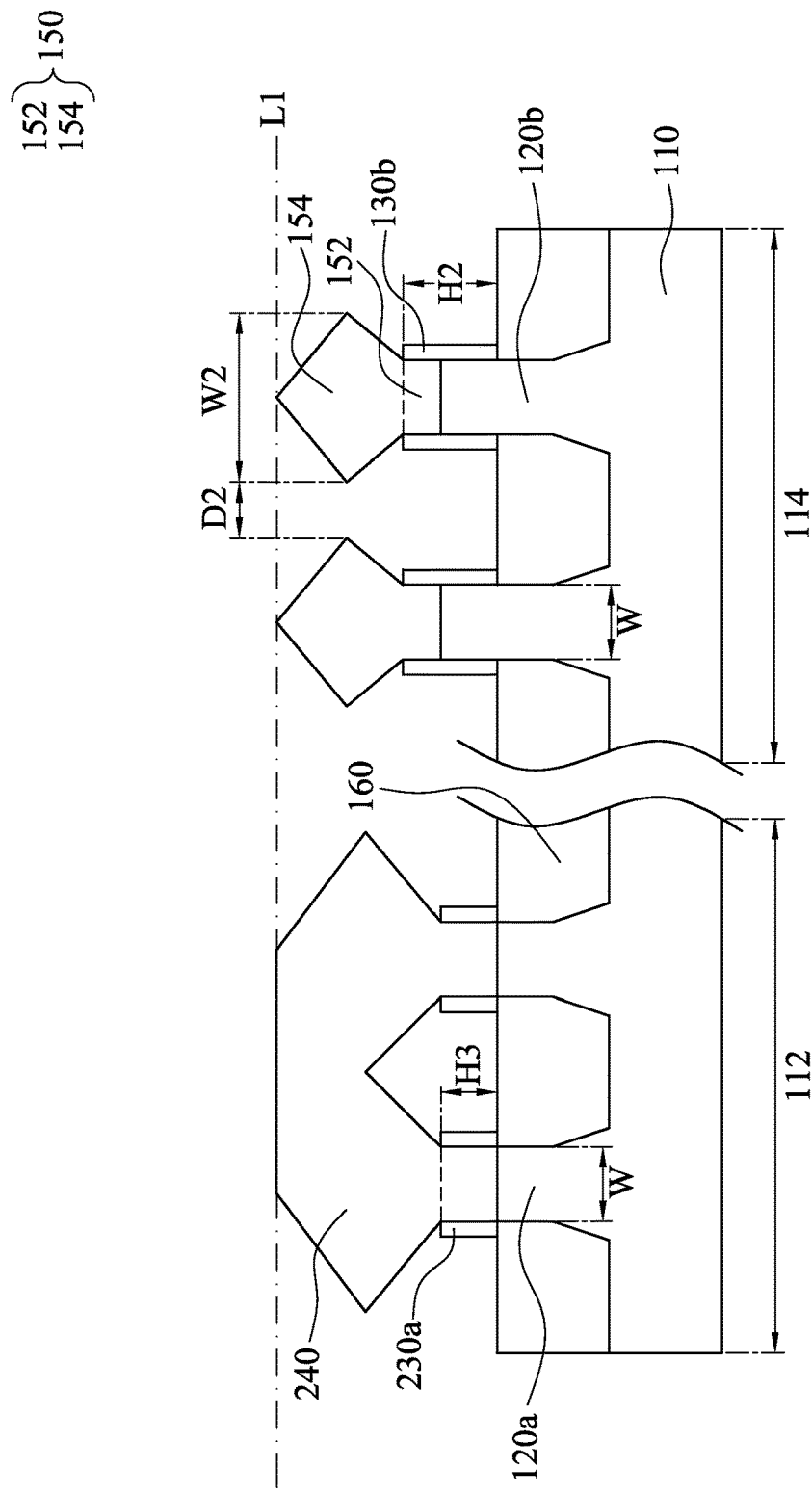

Referring to FIGS. 4A and 4B, FIGS. 4A and 4B are cross-sectional views of the semiconductor structure 200 in FIGS. 2A and 2B at an intermediate stage of fabrication, in accordance with various embodiments. Specifically, FIGS. 4A and 4B are cross-sectional views in next stages after recessing the second fin structure 120b and the second fin spacer 130b, as shown in FIG. 3C. In FIG. 4A, the first fin structure 120a and first fin spacers 230a are recessed to form a third recess 415 having a depth d3 in the first fin structure 120a. The top surface of the first fin structure 120a is on a level L1 before recessing, and then the top surface is recessed to a level lower than the level L1, which the depth d3 is defined as a distance between a bottom of the recess 415 and the level L1. In this step, a second photoresist 330 is applied to protect the test region 114, and the first fin structure 120a and the first fin spacer 230a in the device region 112 are simultaneously recessed by an selective etching process in a third period of time T3, which a removing rate of the first fin structure 120a is greater than a removing rate of the first fin spacer 230a. Therefore, a height of the first fin structure 120a above the isolation structure 160 is lower than a third height H3 of the first fin spacer 230a after the recessing process.

It is worth noting that the third period of time T3 is longer than the first period of time T1, so the height of the first fin spacer 230a is recessed to the third height H3, which is less than the first height H1. The third height H3 and the second height H2 are designed to achieve target dimensions of a subsequent epitaxial structure, which will b e described in details later.

In FIG. 4B, a first epitaxy structure 140 and a second epitaxy structure 150 are grown respectively in and filled the recesses 315 and 325. This step is similar to the step mentioned in FIG. 3E, and the details are not described herein. To be noticed, the values of the first proximate distance D1 and the second proximate distance D2 are respectively determined by the third height H3 of the first fin spacer 230a and the second height H2 of the second fin spacer 130b. Since the third height H3 of the first fin spacers 230a is less than the first height H1 of first fin spacers 130a, the second portion 144 of first epitaxy structure 140 is expand horizontally to form a width greater than the first width W1, and thus further shortens the first proximate distance D1. When the first proximate distance D1 is less than zero, the two adjacent first epitaxy structures 140 in the device region 112 are in contact with each other and merged into a merged epitaxy structure 240, which has larger volume and thus increase the performance of the semiconductor structure 200. To be noticed, the two adjacent second epitaxy structures 150 in the test region 114 are still separated by the second proximate distance D2 to increase the yield of the semiconductor structure 200.

The embodiments of the present disclosure discussed above have advantages over existing methods and structures, and the advantages are summarized below. According to some embodiments, an improved structure is provided having epitaxy structures with different volumes respectively in the device region and the test region. The epitaxy structures in the test region have smaller volumes to separate them from a desired distance, so as to prevent the epitaxy structures merge and decrease the yield of the semiconductor structure. On the other hand, the epitaxy structures in the device region are grown to larger volumes, which is even achieved by merging two adjacent epitaxy structures, to increase the performance and efficiency of the semiconductor structure. Summarize above points, the improved method and/or structure is provided to form larger epitaxy structures in the device region to increase the performance, and smaller epitaxy structures are simultaneously formed in the test region to increase the yield.

In accordance with some embodiments, the present disclosure discloses a semiconductor structure including a device region and a test region. The device region includes a first fin structure, first fin spacers, and a first epitaxy structure. The first fin spacers cover sidewalls of the first fin structure and having a first height, and the first epitaxy structure is disposed in the first fin structure, and a portion of the first epitaxy structure is above the first fin spacers and having a first width. The test region is adjacent to the first region and including a second fin structure, second fin spacers and second epitaxy structure. The second fin spacers cover sidewalls of the second fin structure and having a second height, and the second height is greater than the first height. The second epitaxy structure is disposed in the second fin structure, and a portion of the second epitaxy structure is above the second fin spacers and having a second width, which the second width is less than the first width.

In accordance with various embodiments, the present disclosure discloses a semiconductor structure including first fin structures, first fin spacers, first epitaxy structures, second fin structures, second fin spacers and second epitaxy structures. The first fin spacers cover sidewalls of the first fin structures and having a first height. The first epitaxy structures are respectively disposed in the first fin structures, and a first proximate distance is between the two adjacent first epitaxy structures. The second fin spacers cover sidewalls of the second fin structures and having a second height, and the second height is greater than the first height. The second epitaxy structures are respectively disposed in the second fin structures, and a second proximate distance is between the two adjacent second epitaxy structures, which the second proximate distance is greater than the first proximate distance.

In accordance with various embodiments, the present disclosure discloses method of fabricating a semiconductor structure, and the method includes following steps. A first fin structure and a second fin structure are formed from a substrate, and first fin spacers and second fin spacers are respectively covered on sidewalls of the first fin structure and the second fin structures. The first fin structure and the first fin spacer are recessed to form a first recess in the first fin structure, and the second fin structure and the second fin spacer are recessed to form a second recess in the second fin structure, and a depth of the second recess is less than a depth of the first recess. A first epitaxy structure and a second epitaxy structure are grown respectively in the first recess and the second recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   an isolation structure above a substrate;
   a device region, comprising:
      a first fin structure;
      first fin spacers above the isolation structure, covering sidewalls of the first fin structure, and having a first height; and
      a first epitaxy structure disposed above the first fin structure, a portion of the first epitaxy structure being above the first fin spacers and having a first width; and
   a test region, comprising:
      a second fin structure, wherein a height of the second fin structure is greater than a height of the first fin structure;
      second fin spacers above the isolation structure, covering sidewalls of the second fin structure, and having a second height, the second height of the second fin spacers being greater than the first height of the first fin spacers; and
      a second epitaxy structure disposed above the second fin structure, a portion of the second epitaxy structure being above the second fin spacers and having a second width, the second width being less than the first width, wherein a top of the first epitaxy structure and a top of the second epitaxy structure are on the same level.

2. The semiconductor structure of claim 1, further comprising cap layers respectively covering the first epitaxy structure and the second epitaxy structure.

3. The semiconductor structure of claim 1, wherein the portion of the first epitaxy structure and the portion of the second epitaxy structure are diamond shaped.

4. The semiconductor structure of claim 3, wherein the portion of the first epitaxy structure and the portion of the second epitaxy structure comprise four facets having (1, 1, 1) crystallographic orientation.

5. The semiconductor structure of claim 1, wherein the portion of the first epitaxy structure is larger than the portion of the second epitaxy structure in thickness.

6. The semiconductor structure of claim 1, wherein the first width is extended on a level different from that of the second width.

7. The semiconductor structure of claim 1, wherein the first epitaxy structure and the second epitaxy structure comprise silicon, silicon germanium, or a combination thereof.

8. The semiconductor structure of claim 1, further comprising an isolation structure between two adjacent ones of a plurality of first fin structures that include the first fin structure or two adjacent ones of a plurality of second fin structures that include the second fin structure.

9. The semiconductor structure of claim 1, further comprising gate structures respectively on and across the first fin structure and the second fin structure.

10. The semiconductor structure of claim 1, wherein top surfaces of the first fin structure and the second fin structure are above a top surface of the isolation structure.

11. A semiconductor structure, comprising:
   an isolation structure above a substrate;
   first fin structures;
   first fin spacers above the isolation structure, covering sidewalls of the first fin structures, and having a first height;
   first epitaxy structures respectively disposed above the first fin structures, and a first proximate distance being between two adjacent first epitaxy structures the first epitaxy structures being grown into a merged epitaxy structure;
   second fin structures, wherein a height of at least one of the second fin structures is greater than a height of at least one of the first fin structures;
   second fin spacers above the isolation structure, covering sidewalls of the second fin structures, and having a second height, the second height of the second fin spacers being greater than the first height of the first fin spacers; and
   second epitaxy structures respectively disposed in the second fin structures, a second proximate distance being between two adjacent second epitaxy structures.

12. The semiconductor structure of claim 11, wherein the two adjacent second epitaxy structures are not in contact with each other.

13. The semiconductor structure of claim 11, wherein the first proximate distance between the two adjacent first epitaxy structures is less than zero.

14. The semiconductor structure of claim 11, wherein tops of the first epitaxy structures and tops of the second epitaxy structures are on the same level.

15. A semiconductor structure, comprising:
- an isolation structure above a substrate;
- a first fin structure extending from the substrate;
- first fin spacers over the isolation structure and on opposite sidewalls of the first fin structure, the first fin spacers defining a first recess therebetween;
- a first epitaxy structure disposed above the substrate and extending into the first recess;
- a second fin structure extending from the substrate;
- second fin spacers over the isolation structure and on opposite sidewalls of the second fin structure, the second fin spacers defining a second recess therebetween shallower than the first recess; and
- a second epitaxy structure disposed above the substrate and extending into the second recess.

16. The semiconductor structure of claim 15, wherein the isolation structure is disposed between the first fin spacers and the substrate.

17. The semiconductor structure of claim 16, wherein a top surface of the first fin structure is higher than a top surface of the isolation structure.

18. The semiconductor structure of claim 15, wherein a height of one of the first fin spacers is greater than a height of one of the second fin spacers.

19. The semiconductor structure of claim 15, wherein a top of the first epitaxy structure and a top of the second epitaxy structure are on the same level, and a bottom of the first epitaxy structure and a bottom of the second epitaxy structure are on different levels.

20. The semiconductor structure of claim 15, wherein a height of the first epitaxy structure is greater than a height of the second epitaxy structure.

\* \* \* \* \*